(12) United States Patent
Takada et al.

(10) Patent No.: US 10,028,387 B2
(45) Date of Patent: Jul. 17, 2018

(54) ELECTRONIC PART BONDING SUBSTRATE

(71) Applicant: FUJITSU LIMITED, Kawasaki-shi, Kanagawa (JP)

(72) Inventors: Katsumi Takada, Kawasaki (JP); Hiroshi Kurosawa, Kawasaki (JP); Masayuki Itoh, Kawasaki (JP); Yoshinori Mesaki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/813,617

(22) Filed: Nov. 15, 2017

(65) Prior Publication Data

US 2018/0153029 A1      May 31, 2018

(30) Foreign Application Priority Data

Nov. 29, 2016   (JP) ................... 2016-231227
Sep. 7, 2017    (JP) ................... 2017-171853

(51) Int. Cl.
   *H05K 1/18*   (2006.01)
   *H05K 1/02*   (2006.01)
   *H05K 1/11*   (2006.01)
(52) U.S. Cl.
   CPC ........... *H05K 1/181* (2013.01); *H05K 1/0201* (2013.01); *H05K 1/11* (2013.01)

(58) Field of Classification Search
   CPC ...................... H05K 1/0201; H05K 1/181
   See application file for complete search history.

(56) References Cited

U.S. PATENT DOCUMENTS

2004/0021541 A1   2/2004   Otsuka et al.

FOREIGN PATENT DOCUMENTS

| JP | 63-16423 U    | 2/1988 |
| JP | 2001-155937 A | 6/2001 |
| JP | 2002-009428 A | 1/2002 |

*Primary Examiner* — Jeremy C Norris
(74) *Attorney, Agent, or Firm* — Squire Patton Boggs (US) LLP

(57) ABSTRACT

An electronic part bonding substrate includes a substrate, an electronic part mounted on the substrate, a first terminal that extends outwardly from the electronic part, a second terminal that extends outwardly from the first terminal, and a third terminal that extends outwardly from the second terminal, wherein the second terminal being a member having a thermal conductivity lower than a thermal conductivity of a member of the first terminal and a member of the third terminal, and the third terminal being partly or entirely bonded to the substrate by soldering or by a conductive bonding agent.

11 Claims, 10 Drawing Sheets

ELECTRONIC PART BONDING SUBSTRATE

CROSS-REFERENCE TO RELATED APPLICATION

This application is based upon and claims the benefit of priority of the prior Japanese Patent Application No 2016-231227, filed on Nov. 29, 2016, and the prior Japanese Patent Application No. 2017-171853, filed on Sep. 7, 2017, the entire contents of which are incorporated herein by reference.

FIELD

The embodiments disclosed herein are related to an electronic part bonding substrate.

BACKGROUND

There is a lead terminal which includes a structure in which a high electric conductivity material is used as a substrate and is sandwiched from the opposite side faces at a central portion thereof by low heat conductivity electric conductivity materials leaving coupling portions at the opposite ends thereof such that the high electric conductivity material and the low heat conductivity electric conductivity materials are overlapped with and pressure welded to each other.

Meanwhile, there is a surface mount type coil which includes a drum type core including a pair of flanges formed integrally at the opposite ends of a wrapping core, a winding wound on the wrapping core and base electrodes provided on a circumferential face and an end face of the flanges at the opposite ends of the drum type core and having end portions of the winding coupled thereto (refer to Patent Document 2). An exterior member covers over an area from part of the base electrode on the circumferential face of one of the flanges to part of the circumferential face of the other flange. Terminal electrodes cover over the base electrodes from above the exterior member on the flange circumferential faces. Missing portions expose the base electrodes at projections of the exterior member on the circumferential face of the flanges, which extend toward an end portion of the flanges and regions rather near to the winding core than the projections.

However, since the substrate of a high heat conductivity is left at part of a heat conduction path, thermal energy flows to the electronic part side, and sufficient thermal energy does not stay at the lead terminal and the lead terminal sometimes fails to have a temperature of the melting point of the solder. As a result, it is difficult to solder the lead terminal well.

The followings are reference documents.
[Document 1] Japanese Laid-open Utility Model Publication No. 63-16423, and
[Document 2] Japanese Laid-open Patent Publication No. 2001-155937.

SUMMARY

According to an aspect of the embodiments, an electronic part bonding substrate includes a substrate, an electronic part mounted on the substrate, a first terminal that extends outwardly from the electronic part, a second terminal that extends outwardly from the first terminal, and a third terminal that extends outwardly from the second terminal, wherein the second terminal being a member having a thermal conductivity lower than a thermal conductivity of a member of the first terminal and a member of the third terminal, and the third terminal being partly or entirely bonded to the substrate by soldering or by a conductive bonding agent.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
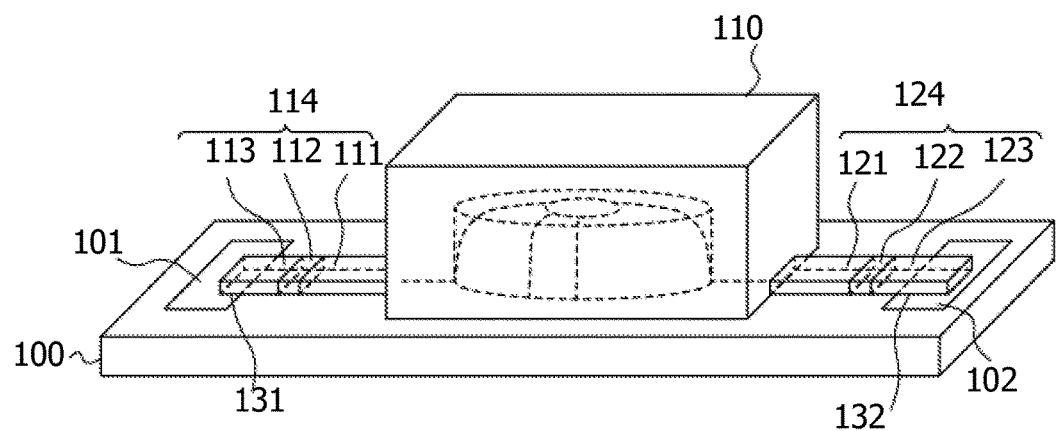
FIGS. 1A and 1B are perspective views depicting an example of a configuration of an electronic part bonding substrate according to an embodiment.

FIG. 1A is a perspective view depicting an example of a configuration of an electronic part bonding substrate according to an embodiment. The electronic part bonding substrate includes a printed wiring substrate 100, an electronic part 110, a terminal unit 114 and another terminal unit 124. Conductive portions 101 and 102 are land patterns and are formed on the surface of the printed wiring substrate 100. The electronic part 110 is mounted on the printed wiring substrate 100.

The electronic part 110 has, for example, a shape of a surface mount device (SMD) that may be reflow-mounted by solders 131 and 132. For example, the electronic part 110 includes a power supply coil or the like for use with a network apparatus and has a size of 30 mm×30 mm (current value 20 A to 30 A class).

Figure 1B:
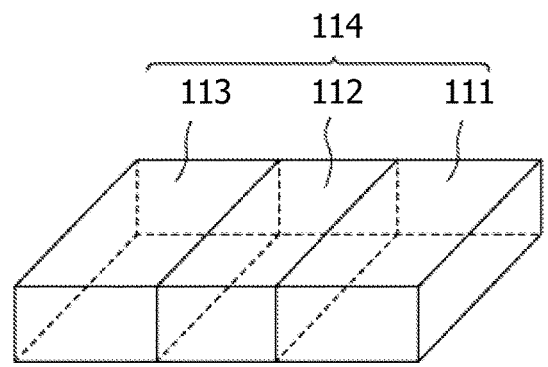

FIG. 1B is an enlarged view of the terminal unit 114. The terminal unit 114 includes a first terminal 111, a second terminal 112, and a third terminal 113. The first terminal 111 extends outwardly from the electronic part 110. The second terminal 112 extends outwardly from the first terminal 111.

The third terminal 113 extends outwardly from the second terminal 112. The second terminal 112 is a member having a thermal conductivity lower than that of the member of the first terminal 111 and the member of the third terminal 113. The third terminal 113 is partly or entirely bonded to the conductive portion 101 of the printed wiring substrate 100 by the solder 131. It is to be noted that a conductive bonding agent may be used in place of the solder 131. Alternatively, the solder 131 may be solder paste.

The terminal unit 124 includes a fourth terminal 121, a fifth terminal 122 and a sixth terminal 123. The fourth terminal 121 extends outwardly from the electronic part 110. The fifth terminal 122 extends outwardly from the fourth terminal 121. The sixth terminal 123 extends outwardly from the fifth terminal 122. The fifth terminal 122 is a member having a thermal conductivity lower than that of the member of the fourth terminal 121 and the member of the sixth terminal 123. The sixth terminal 123 is partly or entirely bonded to the conductive portion 102 of the printed wiring substrate 100 by the solder 132. It is to be noted that a conductive bonding agent may be used in place of the solder 132. Alternatively, the solder 132 may be solder paste.

The first terminal 111 and the fourth terminal 121 are terminal portions led out from the electronic part 110 and are conductive members having a high thermal conductivity and a high electric conductivity. The third terminal 113 and the sixth terminal 123 are terminal portions bonded by the solders 131 and 132 and are conductive members having a high thermal conductivity and a high electric conductivity. The second terminal 112 and the fifth terminal 122 are conductive members having a low thermal conductivity and have an electrical conductivity.

For example, the first terminal 111 and the third terminal 113 are made of copper, and the second terminal 112 is a conductive bonding agent. The material of the second terminal 112 is different from the material of the first terminal 111 and the third terminal 113. The second terminal 112 has one end portion bonded to the first terminal 111 and the other end portion bonded to the third terminal 113. The conductive portion 101 of the printed wiring substrate 100 is made of, for example, copper.

Similarly, the fourth terminal 121 and the sixth terminal 123 are made of copper, and the fifth terminal 122 is a conductive bonding agent. The material of the fifth terminal 122 is different from the material of the fourth terminal 121 and the sixth terminal 123. The fifth terminal 122 has one end portion bonded to the fourth terminal 121 and the other end portion bonded to the sixth terminal 123. The conductive portion 102 of the printed wiring substrate 100 is made of, for example, copper.

It is to be noted that the material of the first terminal 111, third terminal 113, fourth terminal 121 and sixth terminal 123 is not limited to copper but may be a different material such as copper alloy. Meanwhile, the second terminal 112 and the fifth terminal 122 are not limited to a conductive bonding agent but may be made of a metal material (Fe—Ni alloy or the like), a conductive polymer material, a conductive sheet, a conductive resin material or the like. Further, the bonding method of the second terminal 112 to the first terminal 111 and the third terminal 113 may be press welding, press fitting, welding, thermoplastic bonding, photo-curable bonding or the like. This similarly applies also to the bonding method of the fifth terminal 122 to the fourth terminal 121 and the sixth terminal 123.

Figure 2:
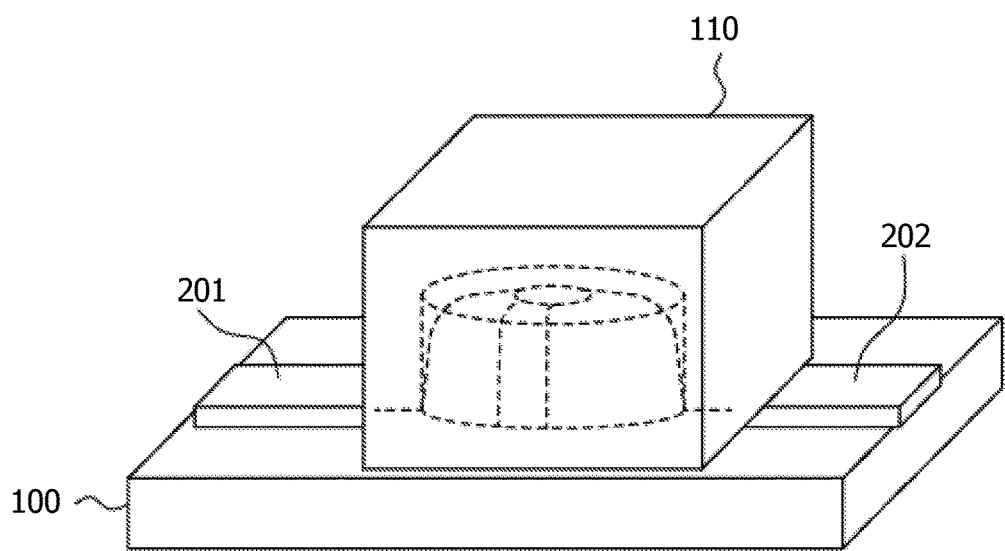
FIG. 2 is a perspective view depicting an example of a configuration of an electronic part bonding substrate according to a comparative example.

FIG. 2 is a perspective view depicting an example of a configuration of an electronic part bonding substrate according to a comparative example. Terminals 201 and 202 of FIG. 2 are provided in place of the terminal units 114 and 124 of FIG. 1A, respectively, and are made of copper.

Figure 3:
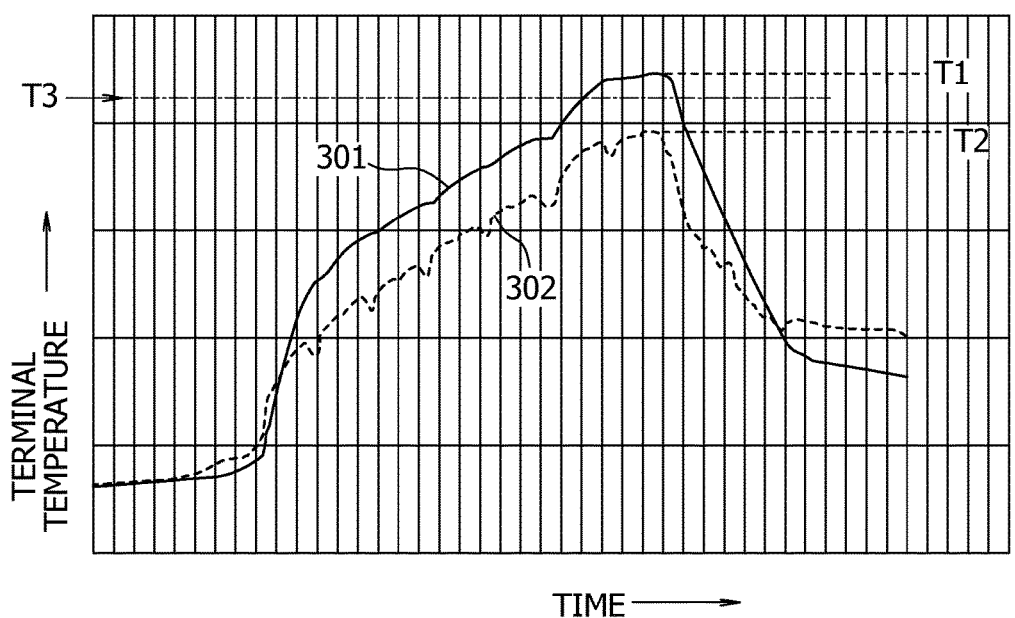
FIG. 3 is a graph depicting a result of an experiment of a temperature variation of an electronic part terminal when an electronic part bonding substrate is passed through a reflow furnace.

FIG. 3 is a graph depicting a result of an experiment of a temperature variation of an electronic part terminal when an electronic part bonding substrate is passed through a reflow furnace. The reflow furnace gradually raises the temperature of the electronic part bonding substrate and then gradually lowers the temperature of the electronic part bonding substrate to solder the terminals of the electronic part 110 to the printed wiring substrate 100. A reflow temperature profile 301 indicates the temperature of a tip end portion of the third terminal 113 of the electronic part bonding substrate of FIG. 1A. A reflow temperature profile 302 indicates the temperature of a tip end portion of the terminal 201 of the electronic part bonding substrate of FIG. 2. The highest temperature T1 of the reflow temperature profile 301 of the electronic part bonding substrate of FIG. 1A is higher than the highest temperature T2 of the reflow temperature profile 302 of the electronic part bonding substrate of FIG. 2. A temperature T3 is the melting point of the solders 131 and 132.

First, the reflow temperature profile 302 of the electronic part bonding substrate of FIG. 2 is described. The terminals 201 and 202 of FIG. 2 are made of copper and are high in thermal conductivity. As the size of the electronic part 110 increases, the heat capacity of the electronic part 110 increases. When the terminals 201 and 202 are heated by the reflow furnace, the heat in the terminals 201 and 202 does not stay in the terminals 201 and 202 but is absorbed by the electronic part 110. As a result, the highest temperature T2 of the terminals 201 and 202 does not become a high temperature. Since the highest temperature T2 is lower than the temperature T3, the solders 131 and 132 are not melted, and the terminals 201 and 202 of the electronic part 110 fail to be soldered well to the printed wiring substrate 100.

Now, the reflow temperature profile 301 of the electronic part bonding substrate of FIG. 1A is described. The second terminal 112 and the fifth terminal 122 of FIG. 1A are a conductive bonding agent and are low in thermal conductivity. When the third terminal 113 and the sixth terminal 123 are heated by the reflow furnace, the heat of the third terminal 113 and the sixth terminal 123 stays in the third terminal 113 and the sixth terminal 123. As a result, the highest temperature T1 of the third terminal 113 and the sixth terminal 123 becomes a high temperature. Since the highest temperature T1 is higher than the temperature T3, the solders 131 and 132 are melted, and consequently, the third terminal 113 and the sixth terminal 123 of the electronic part 110 may be soldered well to the printed wiring substrate 100.

Figure 4A:
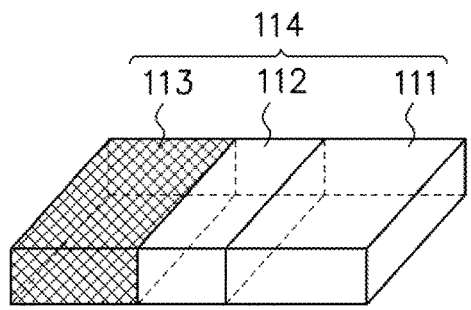
FIGS. 4A to 4D are perspective views depicting an example of a configuration of a terminal portion of an electronic part bonding substrate according to another embodiment.

FIG. 4A is a perspective view depicting an example of a configuration of a terminal unit of an electronic part bonding substrate according to another embodiment. The terminal unit illustrated in FIG. 4A may be the terminal unit 114 depicted in FIG. 1A. In the following, differences of FIG. 4A from FIG. 1B are described. The terminal unit 114 has a first terminal 111, a second terminal 112 and a third terminal 113. The third terminal 113 has a meshed form. For example, the third terminal 113 may have a meshed surface or may be entirely knitted in a mesh pattern from copper wires. It is to be noted that only a tip end portion of the third terminal 113 may be in a meshed form. Since the third terminal 113 has a meshed surface, similarly to a function of a solder suck wire, it becomes easy to suck the solder 131 by a capillary phenomenon, which facilitates soldering. Also the sixth terminal 123 has a meshed form similarly to the third terminal 113.

Figure 4B:
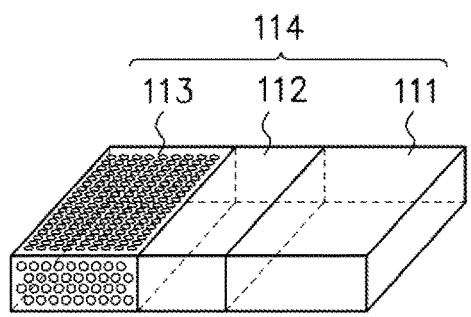

FIG. 4B is a perspective view depicting an example of a configuration of a terminal unit of an electronic part bonding substrate according to a further embodiment. The terminal unit illustrated in FIG. 4B may be the terminal unit 114 depicted in FIG. 1A. In the following, differences of FIG. 4B from FIG. 1B are described. The terminal unit 114 has a first terminal 111, a second terminal 112 and a third terminal 113. The third terminal 113 has a punching metal shape. For example, the third terminal 113 may have a plurality of punching metal through-holes. It is to be noted that the third terminal 113 may have a plurality of punching metal bottomed holes. It is to be noted that the third terminal 113 may have a punching metal shape at a tip end portion thereof. Since the third terminal 113 has a surface of a punching metal shape, similarly to a function of a solder suck wire, it becomes easy to suck the solder 131 by a capillary phenomenon, which facilitates soldering. Also the sixth terminal 123 has a punching metal shape similarly to the third terminal 113.

Figure 4C:
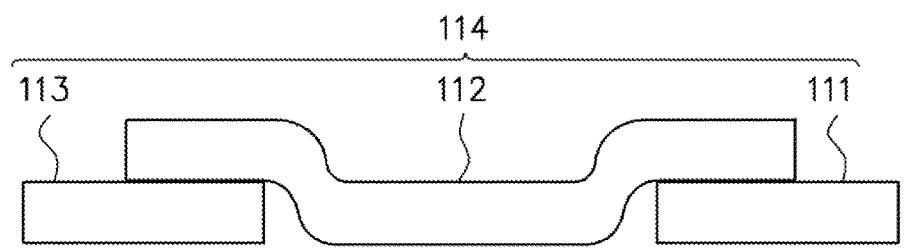

FIG. 4C is a perspective view depicting an example of a configuration of a terminal unit of an electronic part bonding substrate according to a still further embodiment. The terminal unit illustrated in FIG. 4C may be the terminal unit 114 depicted in FIG. 1A. In the following, differences of FIG. 4C from FIG. 1B are described. The terminal unit 114 has a first terminal 111, a second terminal 112 and a third terminal 113. The terminal unit 114 has a bridge shape. The first terminal 111 is bonded at an upper face thereof to a lower face of a right end portion of the second terminal 112. The third terminal 113 is bonded at an upper face thereof to a lower face of a left end portion of the second terminal 112. For example, the second terminal 112 has one end portion and the other end portion of a face of the same side bonded to the first terminal 111 and the third terminal 113, respectively. Consequently, the first terminal 111 and the second terminal 112 have an increased bonding area therebetween and the second terminal 112 and the third terminal 113 have an increased bonding area therebetween, and therefore, the bonding strength is improved.

It is to be noted that also the fourth terminal 121 to the sixth terminal 123 are similar to the first terminal 111 to the third terminal 113, respectively. For example, the fifth terminal 122 has one end portion and the other end portion of a face of the same side bonded to the fourth terminal 121 and the sixth terminal 123, respectively.

Figure 4D:
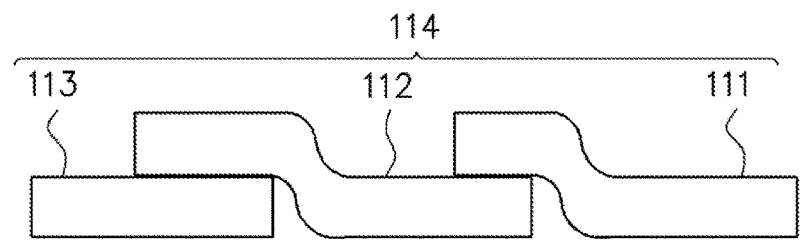

FIG. 4D is a perspective view depicting an example of a configuration of a terminal unit of an electronic part bonding substrate according to a yet further embodiment. The terminal unit illustrated in FIG. 4D may be the terminal unit 114 depicted in FIG. 1A. In the following, differences of FIG. 4D from FIG. 1B are described. The terminal unit 114 has a first terminal 111, a second terminal 112 and a third terminal 113. The terminal unit 114 has an overlap shape. The first terminal 111 is bonded at a lower face thereof to an upper face of a right end portion of the second terminal 112. The third terminal 113 is bonded at an upper face thereof to a lower face of a left end portion of the second terminal 112. For example, the second terminal 112 has a first face bonded to the first terminal 111 and a second face at the opposite side to the first face bonded to the third terminal 113. Consequently, the first terminal 111 and the second terminal 112 have an increased bonding area therebetween and the second terminal 112 and the third terminal 113 have an increased bonding area therebetween, and therefore, the bonding strength is improved.

It is to be noted that also the fourth terminal 121 to sixth terminal 123 are similar to the first terminal 111 to third terminal 113, respectively. For example, the fifth terminal 122 has a first face bonded to the fourth terminal 121 and a second face at the opposite side to the first face bonded to the sixth terminal 123.

According to the embodiments described above, the second terminal 112 is a member having a lower thermal conductivity than that of the member of the first terminal 111 and the member of the third terminal 113. Further, the fifth terminal 122 is a member having a lower thermal conductivity than that of the member of the fourth terminal 121 and the member of the sixth terminal 123. Consequently, heat radiation from the third terminal 113 and the sixth terminal 123 may be reduced, and the third terminal 113 and the sixth terminal 123 may be bonded well to the printed wiring substrate 100.

Figure 5A:
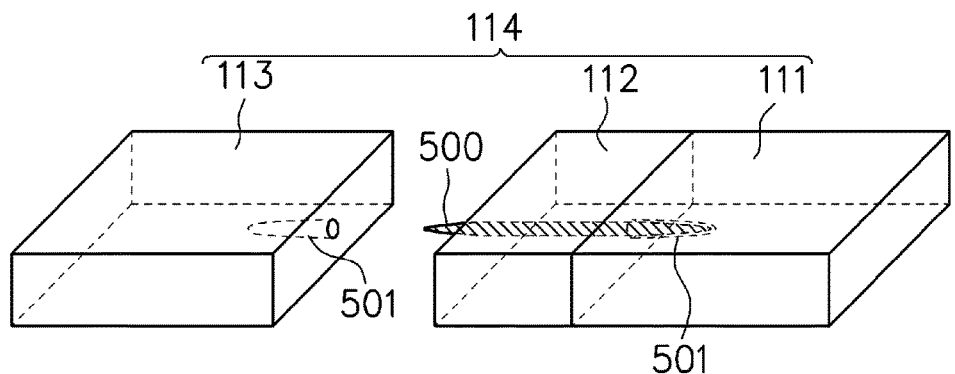
FIGS. 5A to 5C are views depicting an example of a configuration of a terminal unit of an electronic part bonding substrate according to a further embodiment.
Figure 5B:
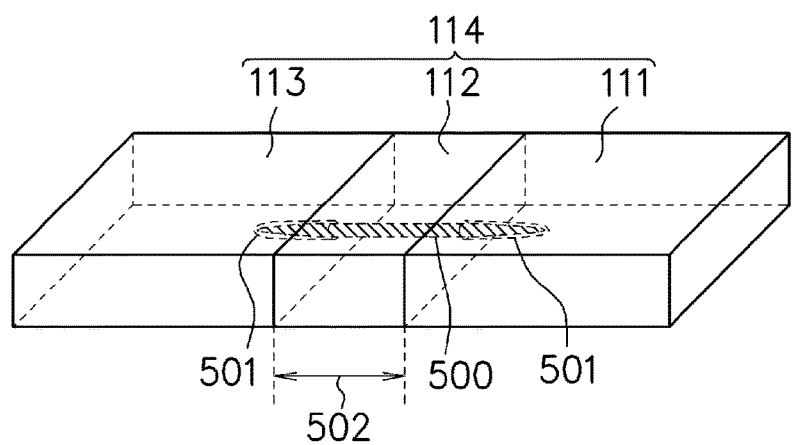
Figure 5C:
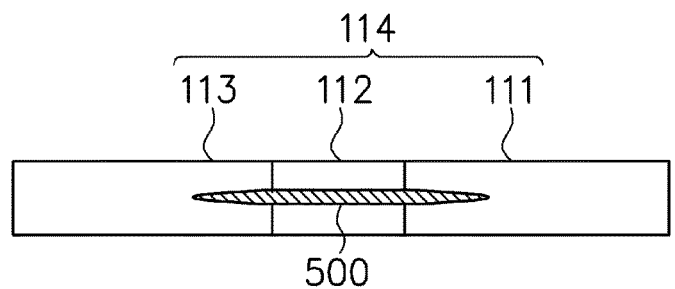

FIGS. 5A and 5B are perspective views depicting an example of a configuration of a terminal unit of an electronic part bonding substrate according to a further embodiment. The terminal unit illustrated in FIGS. 5A and 5B may be the terminal unit 114 depicted in FIG. 1A. FIG. 5C is a sectional view taken in a vertical direction of the terminal unit 114 of FIG. 5B. In the following, differences of the configuration of FIG. 5B from that of FIG. 1B are described. The terminal unit 114 includes a first terminal 111, a second terminal 112 and a third terminal 113 as well as a mandrel 500. The mandrel 500 is a reinforcing member provided for increasing the strength of the terminal unit 114. The material of the mandrel 500 may be a mold material of an epoxy resin, carbon or the like. The second terminal 112 has a thickness 502, for example, of approximately 1 mm.

Now, a production method of the terminal unit 114 is described with reference to FIGS. 5A and 5B. First, as depicted in FIG. 5A, a hole 501 is formed in each of a first terminal 111 and a third terminal 113 by an etching process using drug or corrosion agent. Then, a mandrel 500 is inserted at a right end portion thereof into the hole 501 of the first terminal 111. Then, a second terminal 112 is bonded to the first terminal 111 in such a manner as to cover a central portion of the mandrel 500. Then, the mandrel 500 is inserted at a left end portion thereof into the hole 501 of the third terminal 113, and the second terminal 112 is bonded to the third terminal 113 in such a manner as depicted in FIG. 5B. It is to be noted that the holes 501 have a diameter that decreases as the depth thereof increases from characteristics of the etching process. Preferably, the right end portion and the left end portion of the mandrel 500 have a thickness decreasing toward their extremity in conformity with the shape of the holes 501.

It is to be noted that the order of the production steps described above is not restricted. In the following, another example of the production method is described. First, a hole 501 is formed in each of a first terminal 111 and a third terminal 113. Then, a mandrel 500 is inserted at a left end portion thereof into the hole 501 of the third terminal 113. Then, a second terminal 112 is bonded to the first terminal 111. Then, the mandrel 500 is operated such that a right end portion thereof penetrates the second terminal 112 until it is inserted into the hole 501 of the first terminal 111, and the third terminal 113 is bonded to the second terminal 112.

As depicted in FIG. 5B, the terminal unit 114 includes a first terminal 111, a second terminal 112, a third terminal 113 and a mandrel 500. The first terminal 111 includes a hole 501 provided on a face thereof opposing to the second terminal 112. The third terminal 113 includes a hole 501 provided on a face thereof opposing to the second terminal 112. The mandrel 500 penetrates the second terminal 112 and is provided in the hole 501 of the first terminal 111 and the hole 501 of the third terminal 113.

It is to be noted that a terminal unit 124 of FIG. 1A includes a configuration similar to that of the terminal unit 114 described above. The terminal unit 124 includes a fourth terminal 121, a fifth terminal 122, a sixth terminal 123 and a mandrel 500. The fourth terminal 121 includes a hole 501 provided on a face thereof opposing to the fifth terminal 122. The sixth terminal 123 includes a hole 501 provided on a face thereof opposing to the fifth terminal 122. The mandrel 500 penetrates the fifth terminal 122 and is provided in the hole 501 of the fourth terminal 121 and the hole 501 of the sixth terminal 123.

Figure 6A:
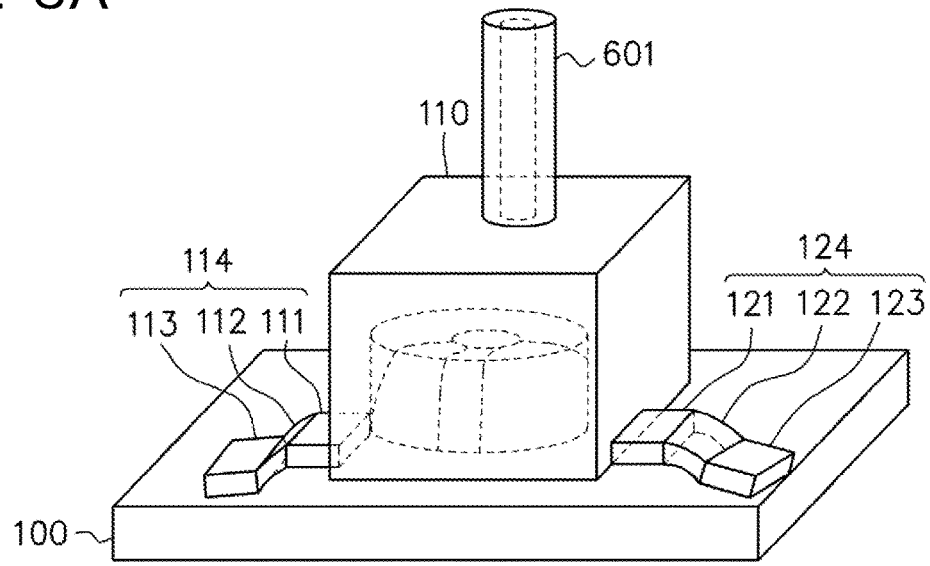
FIGS. 6A to 6C are views depicting deformation and displacement of a second terminal and a fifth terminal.
Figure 6B:
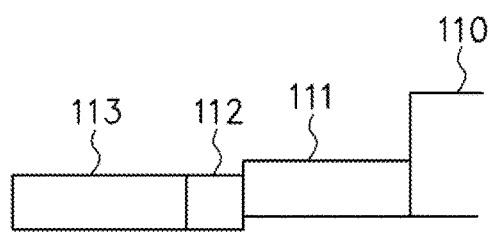
Figure 6C:
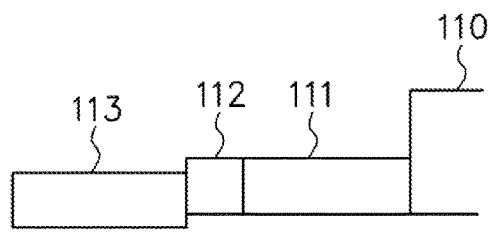

Now, an advantageous effect arising from the provision of the mandrel 500 is described with reference to FIGS. 6A to 6C. FIGS. 6A to 6C are views depicting deformation and displacement of a second terminal and a fifth terminal. FIG. 6A is a perspective view depicting a production step of an electronic part bonding substrate where it does not have the mandrel 500 and depicts a state before an electronic part 110 to which the terminal units 114 and 124 are coupled is soldered to a printed wiring board 100. A part suction nozzle 601 sucks an upper face of the electronic part 110 and moves the electronic part 110, to which the terminal units 114 and 124 are coupled, to a position above the printed wiring board 100. The second terminal 112 is sometimes softer than the first terminal 111 and the third terminal 113, and the fifth terminal 122 is sometimes softer than the fourth terminal 121 and the sixth terminal 123. Where the mandrel 500 is not provided, the weight of the third terminal 113 may extend and deform the second terminal 112 or may break the second terminal 112 at the bonded face thereof to the first terminal 111 or the third terminal 113. Similarly, the weight of the sixth terminal 123 may extend and deform the fifth terminal 122 or may break the fifth terminal 122 at the bonded face thereof to the fourth terminal 121 or the sixth terminal 123. If the second terminal 112 is deformed, then the position of the third terminal 113 with respect to the conductive portion 101 of FIG. 1A is displaced, resulting in the possibility that the third terminal 113 may not be soldered well to the conductive portion 101. This similarly applies also to the deformation of the fifth terminal 122.

Further, as depicted in FIG. 6B, the second terminal 112 is sometimes displaced in the downward direction with respect to the bonded face of the first terminal 111, resulting in decrease of the conductivity at the bonded face thereof. Further, as depicted in FIG. 6C, the third terminal 113 is sometimes displaced in the downward direction with respect to the bonded face of the second terminal 112, resulting in decrease of the conductivity at the bonded face thereof. This similarly applies also the displacement of the fifth terminal 122.

The mandrel 500 is made of a material that may support the weight of the third terminal 113 and preferably is made of a material that does not degrade the conductivity of the terminal unit 114 and the function of the second terminal 112. The provision of the mandrel 500 may suppress deformation, break and displacement of the second terminal 112. Where the second terminal 112 is hard, by providing the mandrel 500, force acting on the bonded faces of the first terminal 111 and the second terminal 112 and force acting on the bonded faces of the second terminal 112 and the third terminal 113 decrease, and break of the second terminal 112 may be suppressed. The mandrel 500 may increase the strength of the terminal unit 114 against stress arising from the weight of the third terminal 113. The foregoing relating to the terminal unit 114 similarly applies also to the terminal unit 124.

Figure 7A:
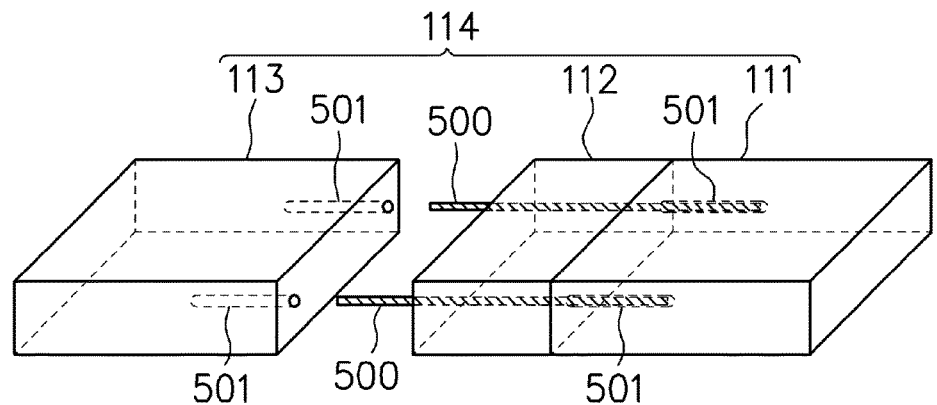
FIGS. 7A to 7C are views depicting an example of a configuration of a terminal unit of an electronic part bonding substrate according to a still further embodiment.
Figure 7B:
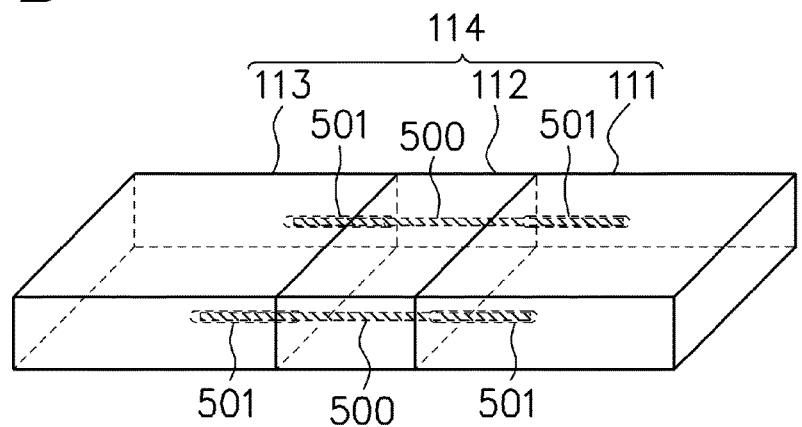
Figure 7C:
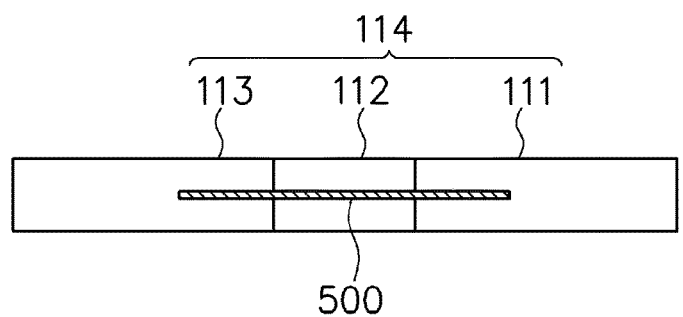

FIGS. 7A and 7B are perspective views depicting an example of a configuration of a terminal unit of an electronic part bonding substrate according to a further embodiment. The terminal unit illustrated in FIGS. 7A and 7B may be the terminal unit 114 depicted in FIG. 1A. FIG. 7C is a sectional view taken in the vertical direction of the terminal unit 114 of FIG. 7B. In the following, differences of the terminal unit 114 of FIG. 7B from that of FIG. 5B are described. The terminal unit 114 includes a first terminal 111, a second terminal 112, and a third terminal 113 as well as two mandrels 500. It is to be noted that the number of such mandrels 500 may be three or more. The mandrels 500 are reinforcing members provided for increasing the strength of the terminal unit 114 and is made of a mold material such as an epoxy region, carbon or the like.

Now, a production method of the terminal unit 114 is described with reference to FIGS. 7A and 7B. First, as depicted in FIG. 7A, two holes 501 are formed in each of a first terminal 111 and a third terminal 113 by an etching process. Then, the two mandrels 500 are inserted at a right end portion thereof into two holes 501 of the first terminal 111. Then, the second terminal 112 is bonded to the first terminal 111 in such a manner as to cover a central portion of the two mandrels 500. Then, the two mandrels 500 are inserted at a left end portion thereof into two holes 501 of the third terminal 113, and the second terminal 112 is bonded to the third terminal 113 as depicted in FIG. 7B. It is to be noted that the mandrels 500 may have a cylindrical shape or have a tapering shape.

It is to be noted that the order of the production steps described above is not restricted. In the following, another example of the production method is described. First, two holes 501 are formed in each of a first terminal 111 and a third terminal 113. Then, two mandrels 500 are inserted at a left end portion thereof into the two holes 501 of the third terminal 113. Then, a second terminal 112 is bonded to the first terminal 111. Then, the two mandrels 500 are operated such that right end portions thereof penetrate the second terminal 112 and are inserted into the two holes 501 of the first terminal 111, and the third terminal 113 is bonded to the second terminal 112.

As depicted in FIG. 7B, the terminal unit 114 includes a first terminal 111, a second terminal 112, a third terminal 113 and a plurality of mandrels 500. The first terminal 111 includes a plurality of holes 501 provided on a face thereof opposing to the second terminal 112. The third terminal 113 includes a plurality of holes 501 provided on a face thereof opposing to the second terminal 112. The plurality of mandrels 500 individually penetrate the second terminal 112 and are provided in the plurality of holes 501 of the first terminal 111 and the plurality of holes 501 of the third terminal 113.

It is to be noted that the terminal unit 124 of FIG. 1A includes a configuration similar to that of the terminal unit 114 described above. The terminal unit 124 includes a fourth terminal 121, a fifth terminal 122, a sixth terminal 123 and a plurality of mandrels 500. The fourth terminal 121 includes a plurality of holes 501 provided on a face thereof opposing to the fifth terminal 122. The sixth terminal 123 includes a plurality of holes 501 provided on a face thereof opposing to the fifth terminal 122. The plurality of mandrels 500 individually penetrate the fifth terminal 122 and are provided in the plurality of holes 501 of the fourth terminal 121 and the plurality of holes 501 of the sixth terminal 123.

Figure 8A:
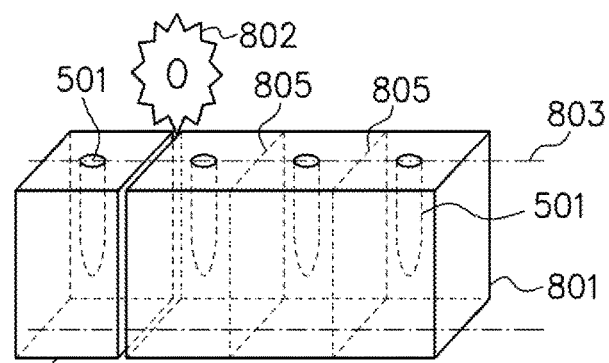
FIGS. 8A to 8E are views depicting a different production method of the terminal unit of FIG. 5B.

FIGS. 8A to 8E are views depicting a different production method of the terminal unit 114 of FIG. 5B. First, a terminal plate 801 of copper is prepared as depicted in FIG. 8A. Then, a plurality of holes 501 are formed on an upper face of the terminal plate 801 by an etching process using drug or corrosion agent. It is to be noted that the plurality of holes 501 may be formed by ionizing gas molecules and causing the ionized gas molecules to collide with hole portions of the upper face of the terminal plate 801. Then, the terminal plate 801 is cut along broken line portions 805 thereof by a dicing saw 802 to form a first terminal 111 including a hole 501 and a third terminal 113 including a hole 501. It is to be noted that a cutter may be used in place of the dicing saw 802.

Figure 8B:
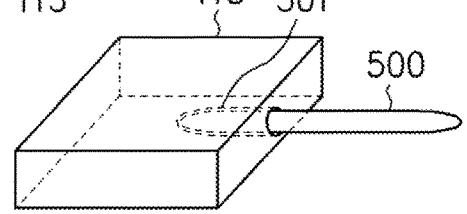
Figure 8C:
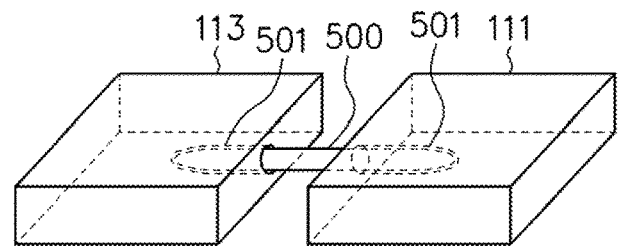

Then, the direction of the third terminal 113 is changed and a mandrel 500 is inserted at a left end portion thereof into the hole 501 of the third terminal 113 as depicted in FIG. 8B. It is to be noted that the mandrel 500 is formed by mold manufacturing, pressure welding or the like of a mold material of an epoxy resin or the like, carbon or the like. Then, the mandrel 500 is inserted at a right end portion thereof into the hole 501 of the first terminal 111 as depicted in FIG. 8C.

Figure 8D:
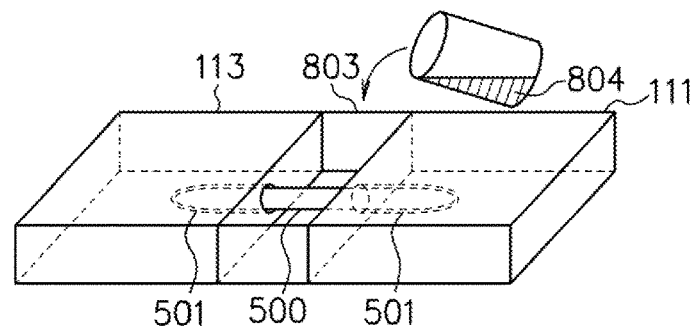
Figure 8E:
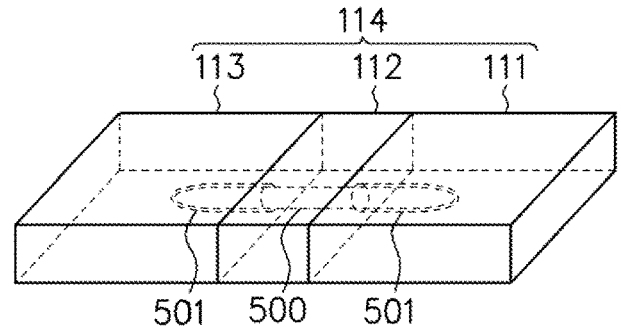

Then, the first terminal 111 and the third terminal 113 in which the mandrel 500 is inserted are placed into a mold 803 as depicted in FIG. 8D. Then, a material 804 for the second terminal 112 such as a conductive bonding agent or the like is poured into a space of the mold 803 between the first terminal 111 and the third terminal 113. The second terminal 112 is solidified between the first terminal 111 and the third terminal 113 as depicted in FIG. 8E. Thereafter, the terminal unit 114 is taken out from the mold 803 of FIG. 8E.

It is to be noted that cutting by the dicing saw 802 in FIG. 8A may be performed not at the step of FIG. 8A but after the step of FIG. 8E. Also the terminal unit 124 may be produced similarly to the terminal unit 114.

Figure 9A:
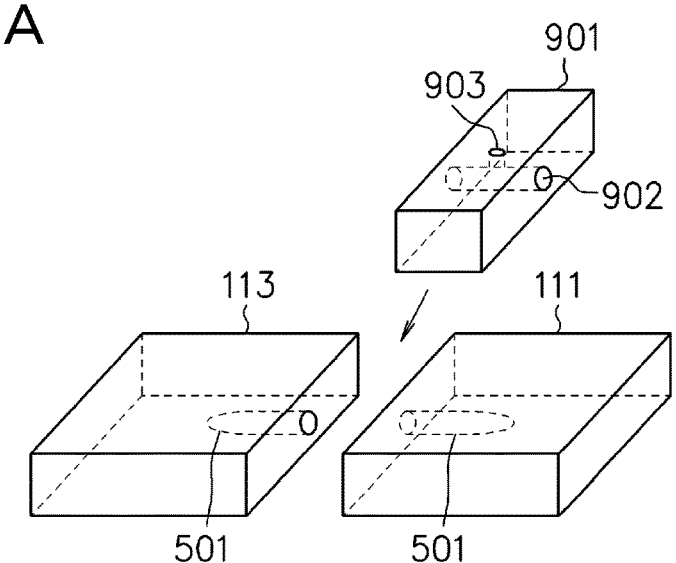
FIGS. 9A to 9C are views depicting another different production method of the terminal unit of FIG. 5B.
Figure 9B:
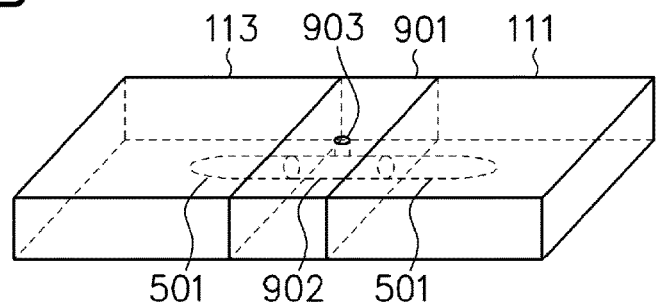
Figure 9C:
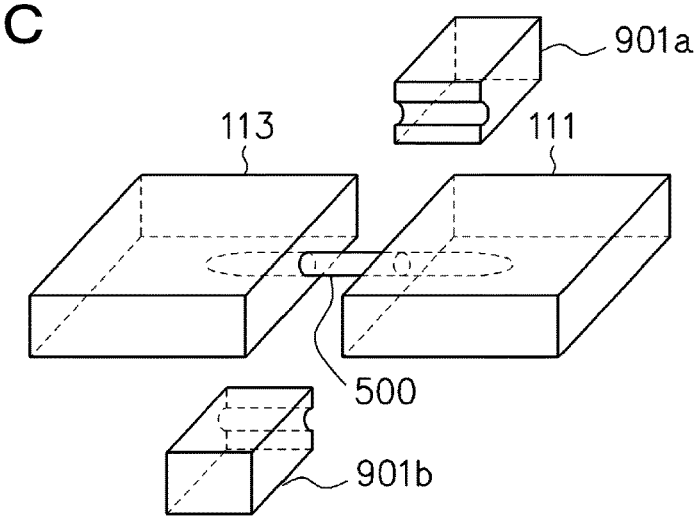

FIGS. 9A to 9C are views depicting another different production method of the terminal unit 114 of FIG. 5B. The mandrel 500 is formed by injection molding. First, a first terminal 111 including a hole 501, a third terminal 113 including a hole 501 and a metal mold 901 are prepared as depicted in FIG. 9A. The holes 501 in the first terminal 111 and the third terminal 113 are formed by a method same as that described hereinabove. The metal mold 901 includes a through-hole 902 for forming a central portion of the mandrel 500, and a fine inlet 903 for injecting a material of the mandrel 500 into the through-hole 902 therethrough.

As depicted in FIG. 9B, the metal mold 901 is disposed between the first terminal 111 and the third terminal 113. The two holes 501 and the through-hole 902 are metal molds corresponding to the shape of the mandrel 500. Then, a material of the mandrel 500 such as resin is injected at a high pressure into the through-hole 902 and the two holes 501 from the inlet 903. Thereafter, the mandrel 500 in the through-hole 902 and the two holes 501 solidifies. Then, the metal mold 901 of FIG. 9B is divided into two metal molds 901a and 901b of FIG. 9C to expose the mandrel 500. Consequently, the first terminal 111 and the third terminal 113 coupled to each other by the mandrel 500 are formed. Thereafter, the second terminal 112 is formed by the steps of FIGS. 8D and 8E described hereinabove to complete the terminal unit 114. It is to be noted that also the terminal unit 124 may be produced similarly to the terminal unit 114.

Figure 10A:
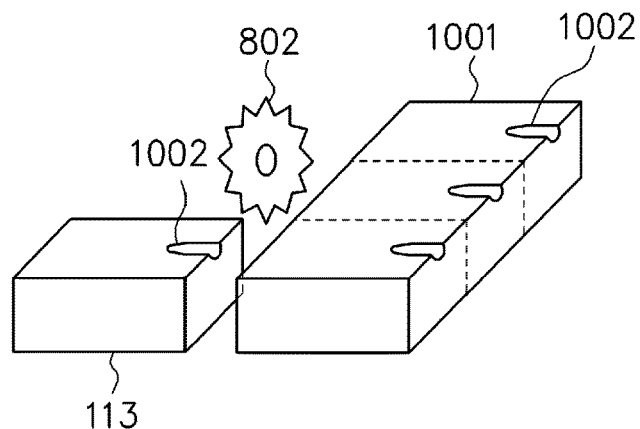
FIGS. 10A to 10D are views depicting a production method of a terminal unit of an electronic part bonding substrate according to a yet further embodiment.

FIGS. 10A to 10D are views depicting a production method of a terminal unit of an electronic part bonding substrate according to a yet further embodiment. The terminal unit illustrated in FIGS. 10A to 10D may be the terminal unit 114 depicted in FIG. 1A. Before the steps of FIGS. 10A to 10D, a plurality of holes 501 are formed on an upper face of a terminal plate 801 by the step of FIG. 8A. Then, the terminal plate 801 is cut in the vertical direction along a line 803 that passes the centers of the plurality of holes 501 to form a terminal plate 1001 including a plurality of recessed portions 1002 as depicted in FIG. 10A. The terminal plate 1001 is one half the terminal plate 801 of FIG. 8A. The recessed portions 1002 are one half part of the holes 501 of FIG. 8A. Then, the terminal plate 1001 is cut along broken line portions of the terminal plate 1001 by the dicing saw 802 to form a first terminal 111 including a recessed portion 1002 and a third terminal 113 including a recessed portion 1002.

Thereafter, the first terminal 111 including the recessed portion 1002 and the third terminal 113 including the recessed portion 1002 are disposed at given intervals. Then, a mandrel 500 is bonded to the recessed portion 1002 of the first terminal 111 and the recessed portion 1002 of the third terminal 113. A right end portion of the mandrel 500 is provided in the recessed portion 1002 of the first terminal 111, and a left end portion of the mandrel 500 is provided in the recessed portion 1002 of the third terminal 113. Then, a second terminal 112 is formed between the first terminal 111 and the third terminal 113 similarly as at the steps of FIGS. 8D and 8E. It is to be noted that, at this step, preferably a material of the second terminal 112 is poured in a state in which the face of the first terminal 111 and the third terminal 113 on which the recessed portions 1002 are provided is directed downwardly. The mandrel 500 is provided in the through-hole or the recessed portion of the second terminal 112.

Figure 10B:
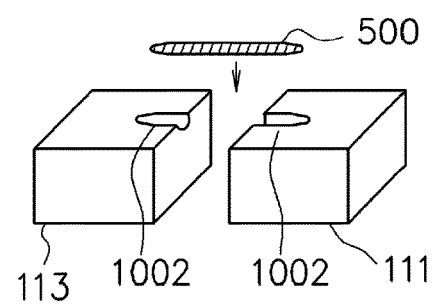
Figure 10C:
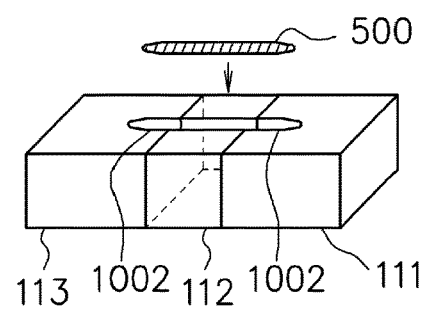

It is to be noted that the step of FIG. 10C may be performed in place of the step of FIG. 10B. A second terminal 112 is formed between the first terminal 111 including the recessed portion 1002 and the third terminal 113 including the recessed portion 1002 as depicted in FIG. 10C. Then, a mandrel 500 is bonded to the recessed portion 1002 of the first terminal 111, the recessed portion of the second terminal 112 and the recessed portion 1002 of the third terminal 113.

Figure 10D:
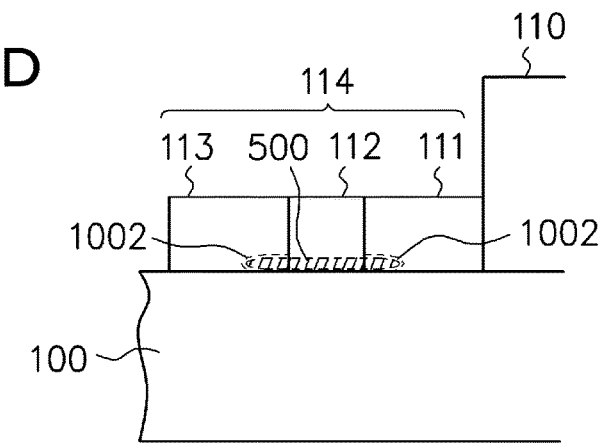

Then, as depicted in FIG. 10D, the terminal unit 114 is disposed on the printed wiring board 100 such that the face of the first terminal 111 and the third terminal 113 of FIG. 10B or 10C on which the recessed portions 1002 are provided is directed downwardly. The mandrel 500 does not protrude from the lower face of the terminal unit 114.

It is to be noted that also it is possible to dispose the terminal unit 114 such that the face thereof on which the mandrel 500 is provided is directed upwardly while the face on which the mandrel 500 is not provided is contacted with the printed wiring board 100. However, the face of the terminal unit 114 on which the mandrel 500 is provided preferably contacts with the printed wiring board 100 thereunder as depicted in FIG. 10D. In this case, since the mandrel 500 may support the gravity of the first terminal 111, the second terminal 112 and the third terminal 113 from below, deformation, break and displacement of the second terminal 112 may be suppressed effectively.

As described above, the terminal unit 114 includes a first terminal 111, a second terminal 112, a third terminal 113 and a mandrel 500. The first terminal 111 includes a recessed portion 1002 provided on a face thereof opposing to the printed wiring board 100. The third terminal 113 includes a recessed portion 1002 provided on a face thereof opposing to the printed wiring board 100. The mandrel 500 is provided in the recessed portion 1002 of the first terminal 111 and the recessed portion 1002 of the third terminal 113 through the second terminal 112. The mandrel 500 is provided in a through-hole or a recessed portion of the second terminal 112.

Similarly, the terminal unit 124 includes a fourth terminal 121, a fifth terminal 122, a sixth terminal 123 and a mandrel 500. The fourth terminal 121 includes a recessed portion 1002 provided on a face thereof opposing to the printed wiring board 100. The sixth terminal 123 includes a recessed portion 1002 provided on a face thereof opposing to the printed wiring board 100. The mandrel 500 is provided in the recessed portion 1002 of the fourth terminal 121 and the recessed portion 1002 of the sixth terminal 123 through the fifth terminal 122. The mandrel 500 is provided in a through-hole or a recessed portion of the fifth terminal 122.

As depicted in FIGS. 5A to 10D, the mandrel 500 couples the first terminal 111, the second terminal 112 and the third terminal 113 to each other and may thereby increase the strength of the terminal unit 114. Similarly, another mandrel 500 couples the fourth terminal 121, the fifth terminal 122 and the sixth terminal 123 to each other and may thereby increase the strength of the terminal unit 124. Since the mandrel 500 is provided, it is possible to suppress deformation, break and displacement of the second terminal 112 and the fifth terminal 122 and form the terminal units 114 and 124 in a high degree of accuracy thereby to increase the quality of soldering.

It is to be noted that the embodiments described above merely indicate examples of materialization in carrying out the technology disclosed herein and the technical scope of the technology disclosed herein shall not be interpreted restrictively. For example, the technology disclosed herein may be carried out in various forms without departing from the technical idea or principal characteristics of the technology.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic part bonding substrate comprising:
   a substrate;
   an electronic part mounted on the substrate;
   a first terminal that extends outwardly from the electronic part;
   a second terminal that extends outwardly from the first terminal; and
   a third terminal that extends outwardly from the second terminal, wherein
   the second terminal being a member having a thermal conductivity lower than a thermal conductivity of a member of the first terminal and a member of the third terminal, and
   the third terminal being partly or entirely bonded to the substrate by soldering or by a conductive bonding agent.

2. The electronic part bonding substrate according to claim 1, wherein
   the third terminal has a tip end portion in a meshed form.

3. The electronic part bonding substrate according to claim 1, wherein
   the third terminal has a tip end portion in a punching metal shape.

4. The electronic part bonding substrate according to claim 1, wherein
   the second terminal has one end portion and the other end portion of a face of the same side bonded to the first terminal and the third terminal, respectively.

5. The electronic part bonding substrate according to claim 1, wherein
   the second terminal has a first face bonded to the first terminal and a second face at the opposite side to the first face bonded to the third terminal.

6. The electronic part bonding substrate according to claim 1, further comprising:
   a member that couples the first terminal, the second terminal and the third terminal to each other.

7. The electronic part bonding substrate according to claim 1, wherein
   the first terminal includes a first hole formed on a face thereof opposite to the second terminal, and
   the third terminal includes a second hole formed on a face thereof opposite to the second terminal;
   the electronic part bonding substrate further comprising:
   a member that penetrates the second terminal and is disposed in the first hole of the first terminal and the second hole of the third terminal.

8. The electronic part bonding substrate according to claim 1, wherein
   the first terminal includes a plurality of first holes formed on a face thereof opposite to the second terminal, and
   the third terminal includes a plurality of second holes formed on a face thereof opposite to the second terminal;
   the electronic part bonding substrate further comprising:
   a plurality of members that penetrate the second terminal and are individually disposed in the plurality of first holes of the first terminal and the plurality second holes of the third terminal.

9. The electronic part bonding substrate according to claim 1, wherein
   the first terminal includes a first recessed portion formed on a face thereof opposite to the substrate, and
   the third terminal includes a second recessed portion formed on a face thereof opposite to the substrate;
   the electronic part bonding substrate further comprising:
   a member that is disposed in the first recessed portion of the first terminal and the second recessed portion of the third terminal through the second terminal.

10. The electronic part bonding substrate according to claim 9, wherein
    the member is provided in a through-hole or a recessed portion of the second terminal.

11. The electronic part bonding substrate according to claim 1, wherein
    a material of the second terminal is different from a material of the first terminal and the third terminal.

* * * * *